(12) United States Patent
Altschul et al.

(10) Patent No.: US 7,148,424 B1
(45) Date of Patent: Dec. 12, 2006

(54) DISPOSABLE ELECTRONIC DEVICES WITH DECONSTRUCTABLE CONSTRUCTION AND METHOD

(75) Inventors: Randice-Lisa Altschul, Cliffside Park, NJ (US); Lee S. Volpe, Mount Laurel, NJ (US)

(73) Assignee: Dynamic Technologies Corp., Calverton, NY (US)

( * ) Notice: Subject to any disclaimer, the term of this patent is extended or adjusted under 35 U.S.C. 154(b) by 750 days.

(21) Appl. No.: 09/971,547

(22) Filed: Oct. 5, 2001

(51) Int. Cl.
*H05K 1/03* (2006.01)
*H05K 1/09* (2006.01)

(52) U.S. Cl. ............... 174/250; 174/254; 174/257; 174/258; 337/297

(58) Field of Classification Search ........ 361/739, 361/748–752, 757, 777–779, 805; 174/250, 174/254–259, 261; 340/572.1, 572.3, 572.8; 337/297
See application file for complete search history.

(56) References Cited

U.S. PATENT DOCUMENTS

| | | | | |
|---|---|---|---|---|
| 3,913,219 A | * | 10/1975 | Lichtblau | 29/592.1 |
| 4,097,894 A | * | 6/1978 | Tanner et al. | 380/208 |
| 4,835,524 A | * | 5/1989 | Lamond et al. | 340/572.3 |
| 4,922,059 A | * | 5/1990 | Walker et al. | 174/254 |
| 5,224,430 A | * | 7/1993 | MacPherson | 109/42 |
| 5,574,431 A | * | 11/1996 | McKeown et al. | 340/572.3 |
| 5,837,367 A | * | 11/1998 | Ortiz et al. | 428/332 |
| 5,936,525 A | * | 8/1999 | Leyden et al. | 340/568.2 |
| 5,965,848 A | | 10/1999 | Altschul et al. | 174/254 |
| 5,999,097 A | * | 12/1999 | Liddle et al. | 340/550 |
| 6,050,622 A | * | 4/2000 | Gustafson | 292/307 R |
| 6,094,133 A | * | 7/2000 | Shimamura et al. | 340/505 |
| 6,421,013 B1 | * | 7/2002 | Chung | 343/700 MS |
| 6,489,891 B1 | * | 12/2002 | Ho et al. | 340/572.3 |
| 6,518,887 B1 | * | 2/2003 | Suzuki et al. | 340/572.8 |
| 6,686,539 B1 | * | 2/2004 | Farquhar et al. | 174/52.3 |
| 6,794,000 B1 | * | 9/2004 | Adams et al. | 428/40.1 |
| 2004/0066296 A1 | * | 4/2004 | Atherton | 340/572.1 |

FOREIGN PATENT DOCUMENTS

WO   WO 01/71848 A1 * 9/2001

OTHER PUBLICATIONS

GOOGLE.COM: Various definitions of "ambient" found on the Internet (2 sheets).*

* cited by examiner

*Primary Examiner*—John B. Vigushin
(74) *Attorney, Agent, or Firm*—Arthur Jacob

(57) ABSTRACT

A disposable electronic device has a body constructed of juxtaposed lengths of an elongate, ribbon-like substrate of dielectric material secured together to establish a multiple-layered self-sustaining structure, and circuitry formed on the substrate. At least a portion of the circuitry is constructed of a deconstructable material which is deconstructed to render the device inoperative by at least one of the following: interrupting a securement of juxtaposed lengths of the substrate, exposing the deconstructable material to at least one of ambient conditions including ambient air, ambient light and ambient moisture, and reaching a predetermined accumulated amount of time during which the circuitry is operated. At least a portion of the substrate is constructed of deconstructable material which is deconstructed by exposure to at least one of the ambient conditions to render the device ready for disposal.

6 Claims, 5 Drawing Sheets

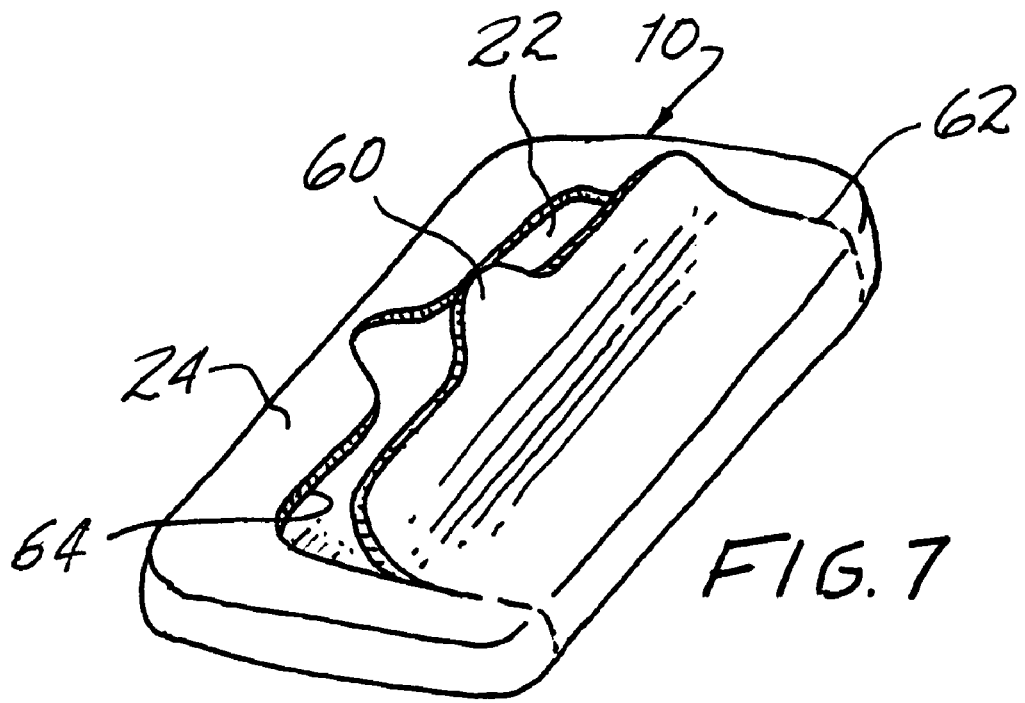
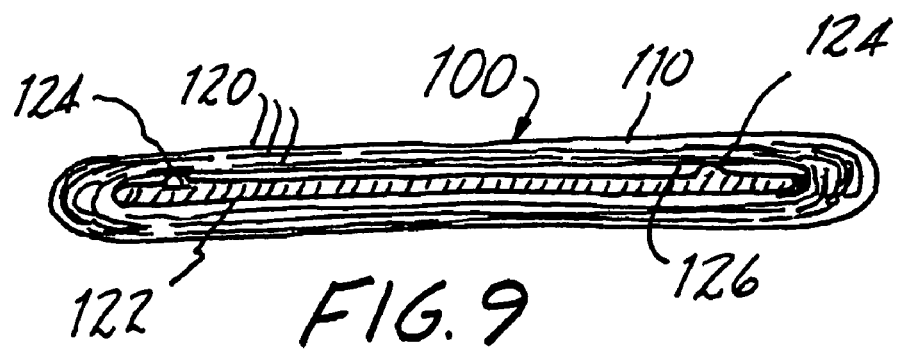
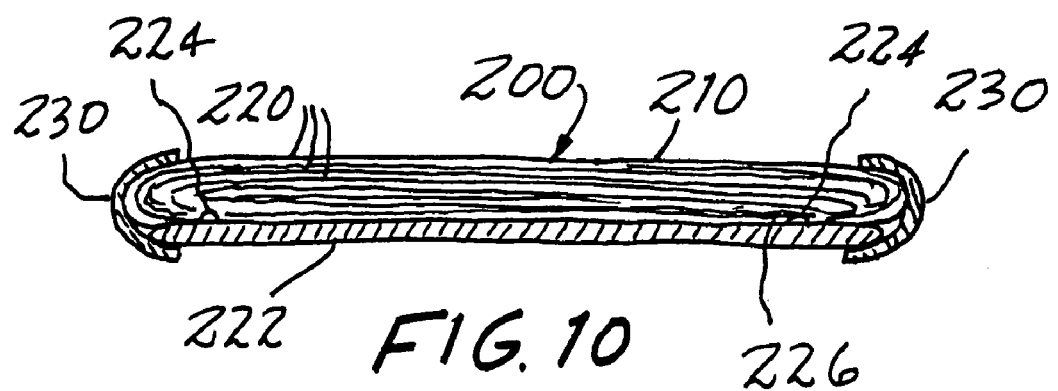

DISPOSABLE ELECTRONIC DEVICES WITH DECONSTRUCTABLE CONSTRUCTION AND METHOD

The present invention relates generally to disposable electronic devices and pertains, more specifically, to disposable electronic devices constructed of deconstructable materials which render the devices more effective in accomplishing the objectives of prescribed limited service life and subsequent convenient safe disposal.

Compact, portable electronic devices have become more prevalent as technological innovations have created a wider variety of such devices for use by more and more individuals. For example, improved cellular communication services have opened up a market for greater numbers of cellular telephones, and that market is being expanded even further with the introduction of disposable cellular telephones. In addition, numerous portable electronic devices are being offered for a myriad of business, commercial and entertainment purposes.

In U.S. Pat. No. 5,965,848, the substance of which is incorporated herein by reference thereto, there is disclosed a technology for the economical manufacture of the above-described electronic devices. The technology renders these devices easier to purchase and use, as well as convenient to vend and discard, thereby creating an even greater demand for larger numbers of such devices and a requirement for the safe and effective disposal of large numbers of expended electronic devices.

The present invention addresses the requirement for effectively expendable electronic devices which are easily discarded for safe disposal in large numbers. As such, the present invention attains several objects and advantages, some of which are summarized as follows: Enables economical manufacture of highly compact electronic devices possessing broad versatility for widespread use; provides an effective construction for attaining a prescribed limited service life in a truly expendable electronic device; precludes tampering to modify the prescribed limited service life built into such electronic devices; renders such electronic devices disposable with increased convenience and safety; utilizes a construction and materials which are degradable upon disposal so as to render such electronic devices ecologically essentially benign, thereby enabling safe and convenient disposal of the large numbers consumed in expanded markets; provides disposable, portable electronic devices of high quality and relatively low cost for reliable operation over a predictable service life.

The above objects and advantages, as well as further objects and advantages, are attained by the present invention which may be described briefly as an improvement in a disposable electronic device having a body constructed of juxtaposed lengths of substrate of dielectric material secured together to establish a multiple-layered self-sustaining structure, and circuitry formed on the substrate, the improvement comprising: at least a portion of the circuitry being constructed of a deconstructable material which deconstructs to render the device inoperative in response to at least one of occurrences including interruption of a securement of juxtaposed lengths of the substrate, exposure of the deconstructable material to at least one of ambient conditions including ambient air, ambient light and ambient moisture, and reaching a predetermined accumulated amount of time during which the circuitry is operated.

In addition, the invention includes a method for rendering a disposable electronic device inoperative and ready for disposal, the disposable electronic device having a body constructed of juxtaposed lengths of substrate of dielectric material secured together to establish a multiple-layered self-sustaining structure, and circuitry formed on the substrate, the method comprising: deconstructing the circuitry through deconstruction of at least a portion of the circuitry constructed of a deconstructable material by at least one step of steps including interrupting a securement of juxtaposed lengths of the substrate, exposing the deconstructable material to at least one of ambient conditions including ambient air, ambient light and ambient moisture, and reaching a predetermined accumulated amount of time during which the circuitry is operated.

Further, the invention includes an improvement in a disposable electronic device having a body constructed of juxtaposed lengths of substrate of dielectric material secured together to establish a multiple-layered self-sustaining structure, and circuitry formed on the substrate, the improvement comprising: at least a portion of one of the substrate and the circuitry being constructed of a deconstructable material which deconstructs in response to exposure of the deconstructable material to at least one of ambient conditions including ambient air, ambient light and ambient moisture.

Still further, the invention includes a method for rendering a disposable electronic device ready for disposal, the disposable electronic device having a body constructed of juxtaposed lengths of substrate of dielectric material secured together to establish a multiple-layered self-sustaining structure, and circuitry formed on the substrate, the method comprising: constructing at least a portion of the substrate of a deconstructable material which deconstructs in response to exposure to at least one of ambient conditions including ambient air, ambient light and ambient moisture; and deconstructing the substrate through deconstruction of at least the portion of the substrate constructed of a deconstructable material by exposing the deconstructable material to at least one of the ambient conditions including ambient air, ambient light and ambient moisture.

The invention will be understood more fully, while still further objects and advantages will become apparent, in the following detailed description of preferred embodiments of the invention illustrated in the accompanying drawing, in which:

FIG. 7 is a pictorial perspective view of an alternate construction providing an additional feature in the module of FIG. 1;

FIG. 9 is a longitudinal cross-sectional view of an alternate module constructed in accordance with the invention; and FIG. 10 is a longitudinal cross-sectional view of another alternate module constructed in accordance with the invention.

Figure 1:
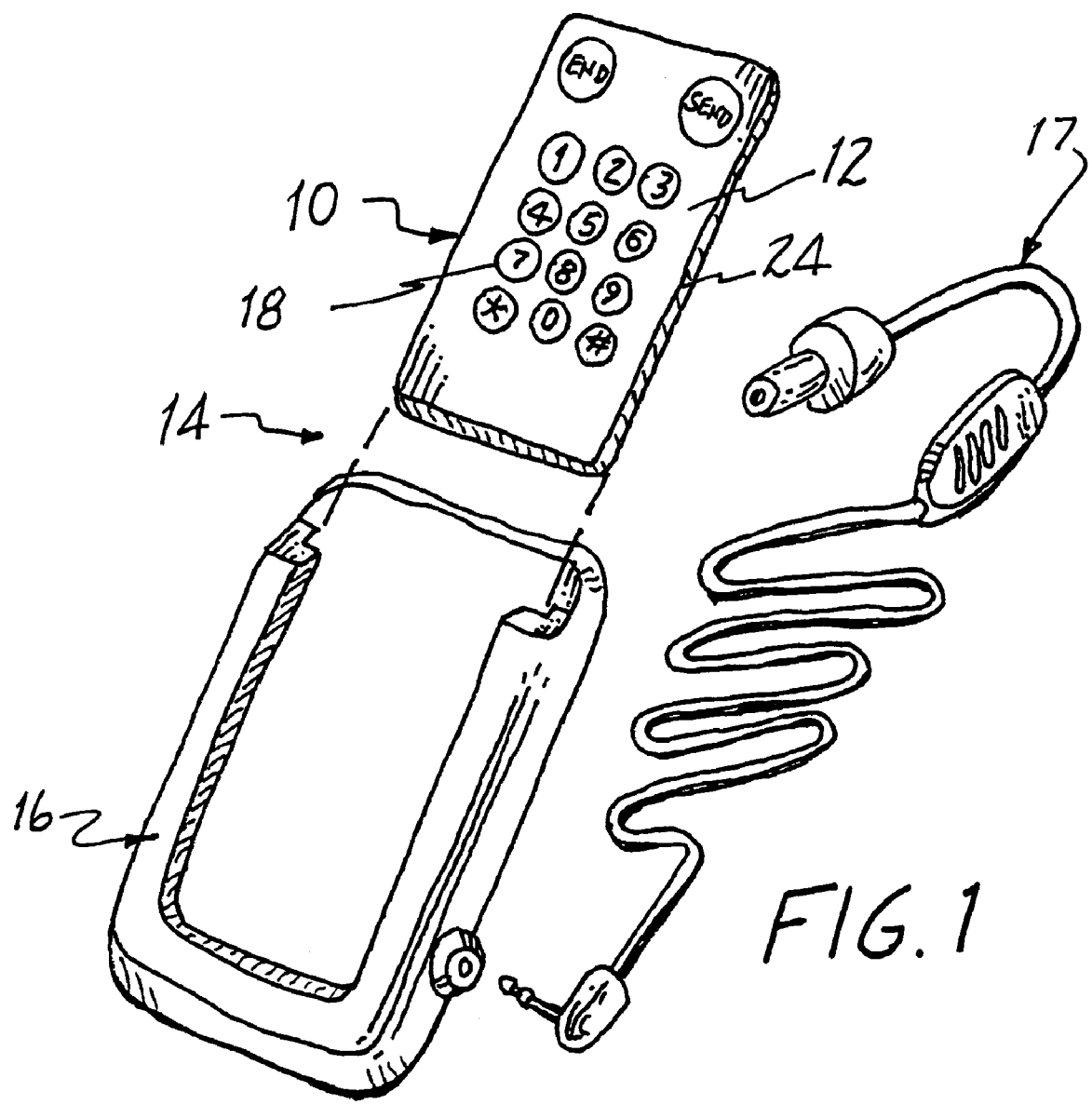
FIG. 1 is a pictorial perspective view of a disposable electronic device in the form of a wireless telephone module constructed in accordance with the present invention and illustrated as a component part of a wireless telephone.

Referring now to the drawing, and especially to FIG. 1 thereof, a disposable electronic device constructed in accordance with the present invention is shown in the form of a wireless telephone module 10 having a body 12. Module 10 is a component part of a wireless telephone 14 which includes a base unit 16 and a headset 17, all as described more fully in copending application Ser. No. 09/741,719, filed Dec. 20, 2000, which application is incorporated herein by reference thereto. As such, module 10 includes a keypad 18 and incorporates circuitry as described in the aforesaid application.

Figure 2:
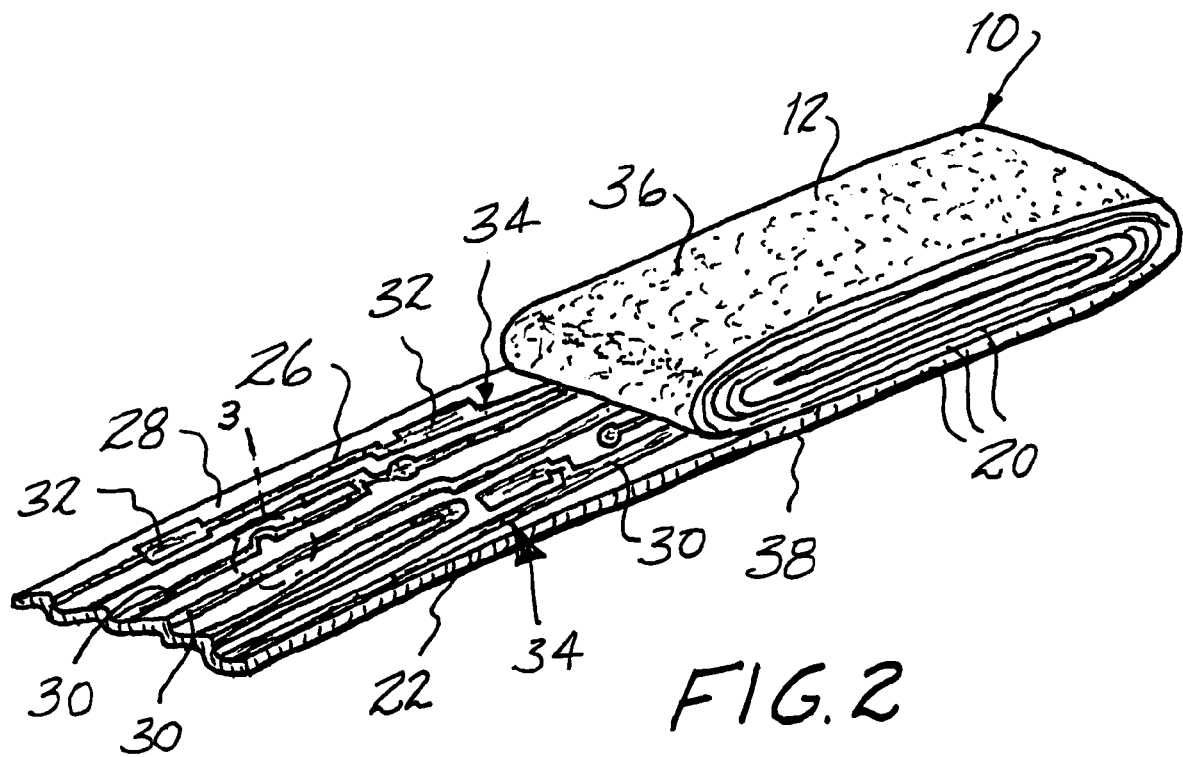
FIG. 2 is a diagrammatic illustration of a stage of the process by which the module of FIG. 1 is manufactured.

Turning now to FIG. 2, as well as to FIG. 1, module 10 is constructed in a manner similar to that described in the aforesaid U.S. Pat. No. 5,965,848; that is, body 12 is constructed of juxtaposed lengths 20 of an elongate, ribbon-like substrate 22 of dielectric material secured together to establish a multiple-layered self-sustaining structure. A sheath 24 encases the structure and protects the laminated lengths 20 of substrate 22 against ambient conditions such as ambient air, ambient light and ambient moisture. Circuitry 26 is formed on one face 28 of the substrate 22 and includes conductors in the form of circuit traces 30 and components 32 which comprise the operating circuits 34 of the module 10. Circuitry 26 is bonded to the face 28 of substrate 22 with a first bond which maintains the integrity of the operating circuits 34. In the construction of module 10, a dielectric adhesive 36 is applied to opposite face 38 of the substrate 22 and secures together the juxtaposed lengths 20 of the substrate 22 in the completed body 12. At the same time, the adhesive 36 bonds at least portions of the circuitry 26 to the opposite face 38 of the substrate 22, at the contiguous length 20 of the substrate 22, with a second bond.

Figure 3:
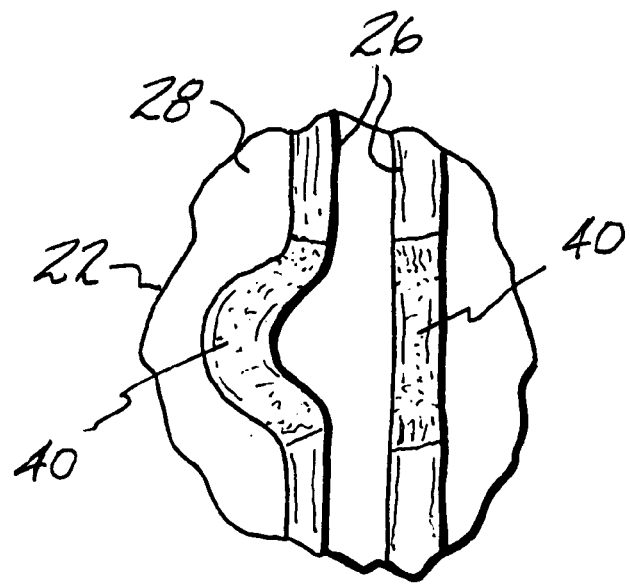
FIG. 3 is an enlarged fragmentary plan view of a portion of FIG. 2 designated by the numeral 3 and illustrating a feature of the module.
Figure 4:
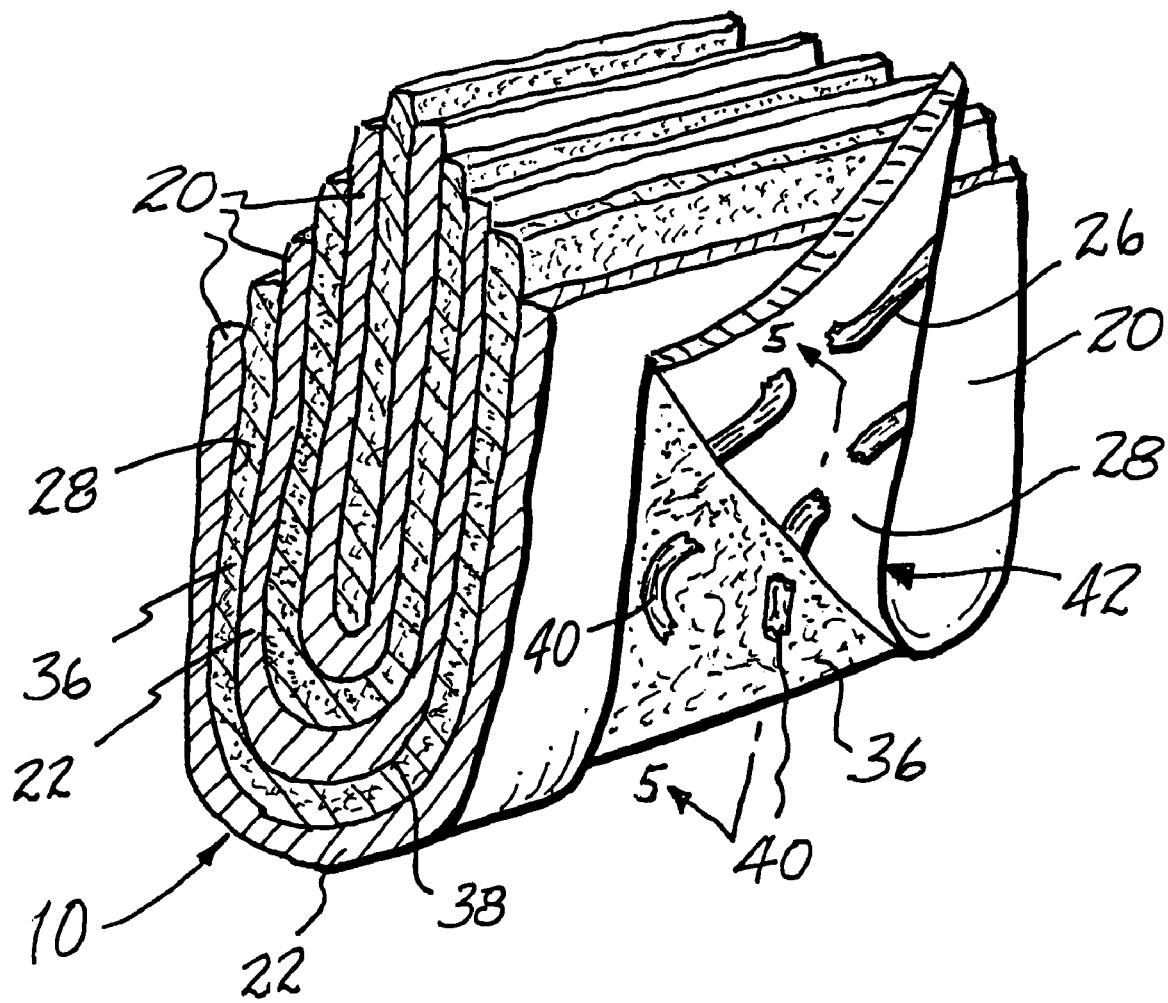
FIG. 4 is a diagrammatic illustration, in cross-section, demonstrating the operation of the feature of the module shown in FIG. 3.
Figure 5:
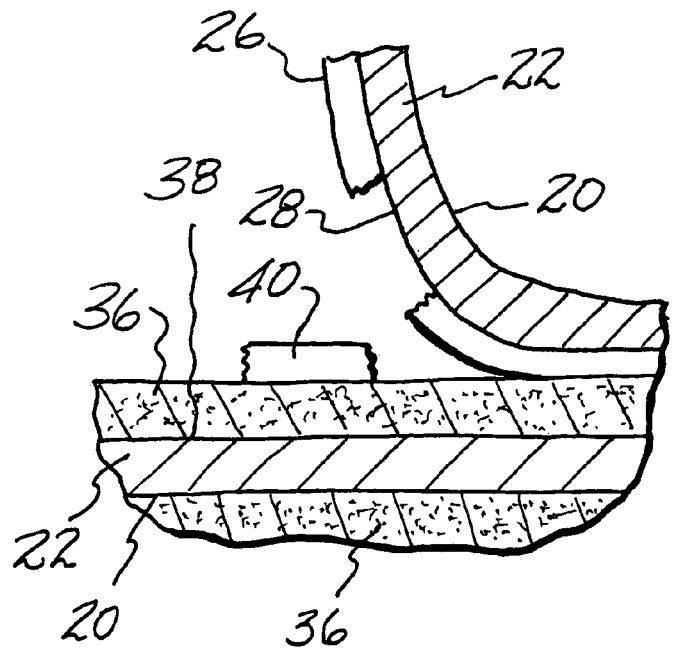
FIG. 5 is an enlarged fragmentary cross-sectional view taken along line 5—5 of FIG. 4.

As seen in FIGS. 3 through 5, the construction of module 10 resists any tampering with the circuitry 26 in efforts to bypass functions built into the module 10 and, in particular, a predetermined limited amount of airtime provided by module 10, as described in the aforesaid application. Thus, the second bond, that is, the bond established by adhesive 36 between the face 38 of the substrate 22 and at least portions of the circuitry 26, is stronger than the first bond between those portions of the circuitry 26 and the face 28 of the substrate 22. As illustrated in FIGS. 4 and 5, the portions of the circuitry 26 bonded to the face 38 with the second bond are shown in the form of circuit trace portions 40 which are constructed at least partially of a deconstructable material. That is, should there be any attempt to gain access to circuitry 26 for the purpose of tampering with the circuitry 26, by physically separating contiguous juxtaposed lengths 20 of substrate 22, as illustrated at 42, the bond between circuit trace portions 40 and face 38, in concert with the deconstructable characteristics of the material of circuit trace portions 40 will tear the trace portions 40 from the face 28 and, at the same time, break the trace portions 40 from the remaining circuitry 26, thereby breaking the operating circuits 34 to deconstruct circuitry 26 and disable the entire module 10. In this manner, module 10 is rendered essentially tamperproof.

As employed in the above description, the term "deconstructable" defines properties of the material of circuit trace portions 40 which enables the trace portions 40 to adhere to face 38 with a second bond greater than the first bond which bonds the trace portions 40 to the face 28 so as to enable tearing of the trace portions 40 from the face 28, as described, and which enables the trace portions 40 to be broken from the remaining circuitry 26 to interrupt the operating circuits 34 and disable the module 10, as described. Thus, the trace portions 40 may be constructed of a more friable conductive material than the remaining portions of the circuitry 26, thereby enabling the above-described anti-tampering construction.

Figure 6:
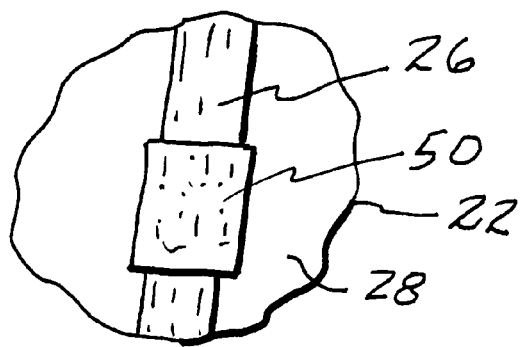
FIG. 6 is an enlarged fragmentary plan view similar to FIG. 3 and showing an alternate construction.

In an alternate construction described in connection with FIG. 6, a circuit trace portion illustrated in the form of a link 50 of deconstructable material is included in circuitry 26. The deconstructable material of link 50 initially is electrically conductive, and subsequently ceases to function as a conductor in response to exposure to any one of several ambient conditions, including ambient air, ambient light and ambient moisture. For example, the addition of oxidizing agents to a conductive material creates a link 50 which will serve as an electrically conductive element of circuitry 26 while protected against exposure to conditions which will activate the oxidizing agents to physically break down, or fuse the link 50. However, upon exposure to one or more ambient conditions, such as ambient air, ambient light or ambient moisture, the oxidizing agents will be activated to fuse the link 50 and establish a non-conducting spot in circuitry 26, thereby deconstructing the circuitry 26 and rendering module 10 inoperative. Thus, during ordinary, authorized use of module 10, sheath 24 remains intact and, being impervious to such ambient conditions as ambient air, ambient light and ambient moisture, serves to protect circuitry 26 against exposure to those ambient conditions. However, any attempt to tamper will disrupt the integrity of the sheath 24, allowing exposure of the circuitry 26 to ambient conditions and concomitant deconstruction of the circuitry 26. In the preferred construction, a plurality of links 50 are placed throughout the circuitry 26 so as to assure exposure of at least one or more links 50 upon any attempt to tamper.

In order to render module 10 conveniently and safely disposable, the ability to deconstruct upon exposure to ambient conditions is extended to the material of substrate 22. Composite materials based upon paper compositions are available which will decompose upon exposure to air, sunlight or moisture, rendering such materials ecologically benign. Thus, the preferred material for substrate 22 is chosen from such paper-based materials or from another biodegradable material which will deconstruct, or degrade, upon exposure to ambient conditions, leaving essentially ecologically benign materials upon discard of an expended module 10. As seen in FIG. 7, sheath 24 preferably is provided with a tear tab 60 formed by a score 62 in the sheath 24. Once module 10 is expended, a user need merely tear the tab 60 from the remainder of sheath 24 to selectively open a portion of the sheath 24, shown in the form of an opening 64, and thus expose the encased substrate 22, and circuitry 26 thereon, to ambient conditions, thereby accelerating deconstruction of the module 10 and providing more effective, safe disposal. Various oxidizing agents may be added to the substrate 22 and circuitry 26 in order to enhance and promote deconstruction.

Figure 8:
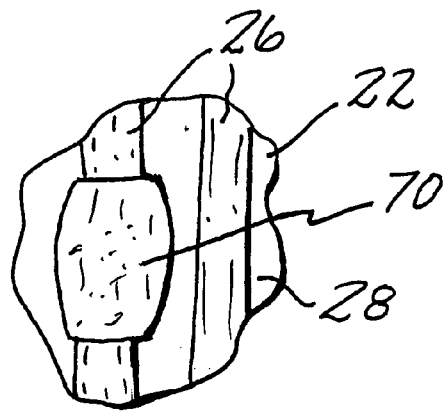
FIG. 8 is an enlarged fragmentary plan view similar to FIG. 3 and showing another alternate construction.

In the embodiment illustrated in FIG. 8, a circuit trace portion illustrated in the form of another link 70 of deconstructable material is included in circuitry 26. The deconstructable material of link 70 ceases to function as a conductor in response to reaching the a predetermined accumulated amount of time during which circuitry 26 is operated with a prescribed current passing through link 70. The physical dimensions of link 70 together with the prescribed current flowing at a given rate combine to render the material of link 70 non-functional as a conductor upon reaching the predetermined accumulated amount of time. In this manner, module 10 is rendered self-regulating and is expended once circuitry 26 has been operated for the predetermined accumulated amount of time.

Turning now to FIG. 9, an alternate embodiment is illustrated wherein a module 100 is constructed in much the same manner as module 10, with the exception that an elongate substrate 110 in being folded or rolled into juxtaposed lengths 120 is wrapped around a power source in the form of a battery 122 having contacts 124 connected to circuitry 126 formed on the substrate 110. Battery 122 need have only a limited amount of power, sufficient to provide the requisite power over the limited lifetime of module 100. Battery 122 is chosen from among batteries which are capable of degrading into essentially ecologically harmless waste upon depletion of power, one such battery being a currently available zinc-air battery.

As an alternate, an external battery may be coupled to a module constructed in accordance with the present invention, as illustrated in FIG. 10. Module 200 is constructed of an elongate substrate 210 formed into juxtaposed lengths 220 and is powered by a battery 222 having contacts 224 connected to circuitry 226 formed on the substrate 210. External clips 230 secure battery 222 in place upon the substrate 210 to complete the powered module 200. When module 200 is expended, clips 230 enable selective detachment of battery 222 for safe disposal separate from disposal of the remainder of module 200.

It will be seen that the present invention attains the several objects and advantages summarized above, namely: Enables economical manufacture of highly compact electronic devices possessing broad versatility for widespread use; provides an effective construction for attaining a prescribed limited service life in a truly expendable electronic device; precludes tampering to modify the prescribed limited service life built into such electronic devices; renders such electronic devices disposable with increased convenience and safety; utilizes a construction and materials which are degradable upon disposal so as to render such electronic devices ecologically essentially benign, thereby enabling safe and convenient disposal of the large numbers consumed in expanded markets; provides disposable, portable electronic devices of high quality and relatively low cost for reliable operation over a predictable service life.

It is to understood that the above detailed description of preferred embodiments of the invention is provided by way of example only. Various details of design, construction and procedure may be modified without departing from the true spirit and scope of the invention as set forth in the appended claims.

The embodiments of the invention in which an exclusive property or privilege is claimed are defined as follows:

1. An improvement in a disposable electronic device having a body constructed of juxtaposed lengths of an elongate, ribbon-like substrate of dielectric material secured together to establish a multiple-layered self-sustaining structure, and circuitry formed on the substrate, the improvement comprising:
at least a portion of the circuitry being constructed of a deconstructable material which deconstructs to render the device inoperative in response to reaching a predetermined accumulated amount of time during which the circuitry is operated.

2. The improvement of claim 1 wherein the substrate comprises paper.

3. An improvement in a disposable electronic device having a body constructed of juxtaposed lengths of an elongate, ribbon-like substrate of dielectric material secured together to establish a multiple-layered self-sustaining structure, and circuitry formed on the substrate, the improvement comprising:
at least a portion of the circuitry being constructed of a deconstructable material which deconstructs to render the device inoperative in response to reaching a predetermined accumulated amount of time during which the circuitry is operated, the portion of the circuitry including at least one link constructed of a deconstructable material initially electrically conductive and rendered non-conductive in response to a prescribed current flow through the link over a predetermined accumulated amount of time, whereby the circuitry is deconstructed and the device is rendered inoperative upon reaching the predetermined accumulated amount of time.

4. An improvement in a disposable electronic device having a body constructed of juxtaposed lengths of an elongate, ribbon-like substrate of dielectric material secured together to establish a multiple-layered self-sustaining structure, and circuitry formed on the substrate, the improvement comprising:
at least a portion of one of the substrate and the circuitry being constructed of a deconstructable material which deconstructs in response to exposure of the deconstructable material to at least one of ambient conditions including ambient air, ambient light and ambient moisture; and
a sheath surrounding the multi-layered self-sustaining structure, the sheath being constructed of a material impervious to at least a corresponding one of ambient air, ambient light and ambient moisture.

5. The improvement of claim 4 wherein the sheath includes a selectively opened portion for selective exposure of the deconstructable material to the ambient conditions.

6. The improvement of claim 4 wherein the substrate comprises paper.

* * * * *